United States Patent [19]
Gatti

[11] Patent Number: 5,539,149
[45] Date of Patent: Jul. 23, 1996

[54] RADIO FREQUENCY INTERFERENCE GASKET

[75] Inventor: John E. Gatti, Scottsdale, Ariz.

[73] Assignee: Motorola, Inc., Schaumburg, Ill.

[21] Appl. No.: 282,401

[22] Filed: Jul. 28, 1994

[51] Int. Cl.$^6$ ............................................ H05K 9/00
[52] U.S. Cl. ............................... 174/35 GC; 361/799
[58] Field of Search ........................... 174/35 R, 35 MS, 174/35 GC; 361/799, 800, 816, 818, 733, 769; 439/108, 65; 364/708.1

[56] References Cited

U.S. PATENT DOCUMENTS

| | | | |
|---|---|---|---|
| 2,825,042 | 2/1958 | Tollefson | 339/253 |
| 3,904,810 | 9/1975 | Uraus | 174/35 MS |
| 4,745,524 | 5/1988 | Patton, III | 364/708.1 X |
| 4,910,920 | 3/1990 | Nichols | 174/35 MS X |
| 5,001,297 | 3/1991 | Peregrim et al. | 174/356 C |
| 5,142,447 | 8/1992 | Cooke et al. | 439/108 X |
| 5,204,496 | 4/1993 | Boulay et al. | 174/35 GC |
| 5,381,314 | 1/1995 | Rudy, Jr. et al. | 361/712 |

*Primary Examiner*—Laura Thomas
*Assistant Examiner*—Christopher Horgan
*Attorney, Agent, or Firm*—Michael D. Bingham

[57] ABSTRACT

A radio frequency interference (RFI) gasket (10) to be used with a chassis (36) having slot panels for receiving electronic assembly boards therein wherein the RFI gasket comprises a metal bar (12) dimensioned to fit within slots of the the chassis and a metallic spring clip (14) that is contiguous with the metal bar and makes electrical contact therewith. The spring clip is compressed against the metal bar as electronic assembly boards are installed into the chassis to such that the RFI gasket makes electrical contact between the the chassis and the assembly board to inhibit RFI radiation.

3 Claims, 2 Drawing Sheets

5,539,149

RADIO FREQUENCY INTERFERENCE GASKET

BACKGROUND OF THE INVENTION

The present invention relates to Radio Frequency Interference (RFI) gaskets and, more particularly, to a RFI gasket for use in electronic system chassis having a plurality of slot subracks for receiving pluggable modules therein. Specifically, the RFI gasket is utilized in a computer connector panel having sub rack slots for receiving computer board modules therein.

Modular computer systems using modular computer boards that are pluggable into a computer chassis are known. Typically, the computer chassis may have sub rack slots formed therein for receiving individual computer boards such as VME boards. The industry has set certain VME standards for the VME sub rack dimensions and a front panel for covering the chassis and the VME computer boards, for example. In general, the spacing between sub rack slots must meet industry standards and can be as little as 0.03 cm plus which can be too small for adding RFI contacts between sub rack assemblies. In one attempt to make RFI contacts that could be used in the aforedescribed computer systems metal clips were used which would clip onto the edge of a VME front panel. However, it has been noted that due to the standard width of the VME front panel, these RFI contact clips tend to cause binding between the pluggable computer boards to the point of not being able to install the computer board modules into the computer chassis. Further, the use of individual RFI contact clips does not necessarily inhibit all RFI leakage from the computer system.

Hence, a need arises for an improved RFI gasket that can be used in modular computer systems to permit easy installation and removal of computer board modules without causing binding problems while inhibiting RFI leakage from the computer system.

DETAILED DESCRIPTION OF THE PREFERRED EMBODIMENT

Figure 1:
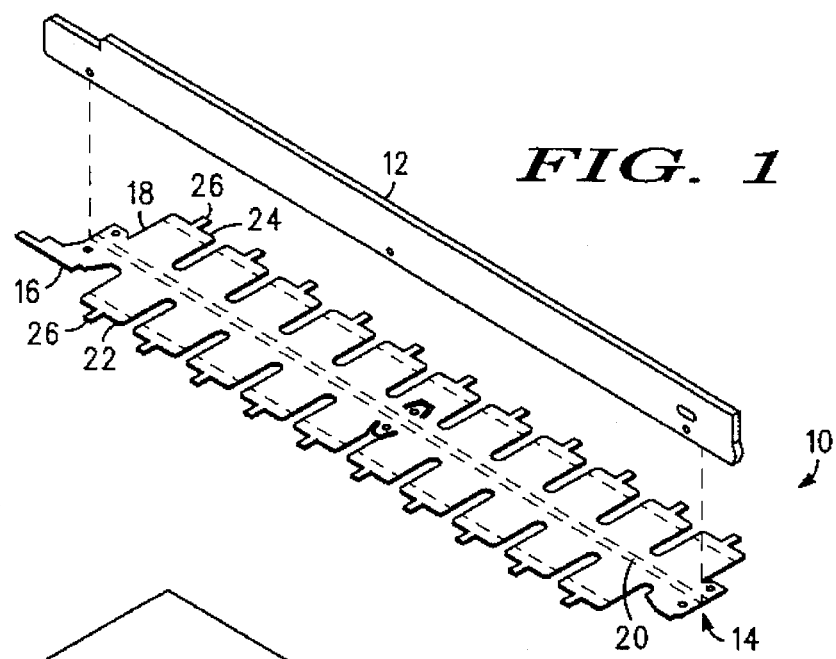
FIG. 1 is an exploded view of the RFI gasket in accordance with the preferred embodiment.
Figure 2:
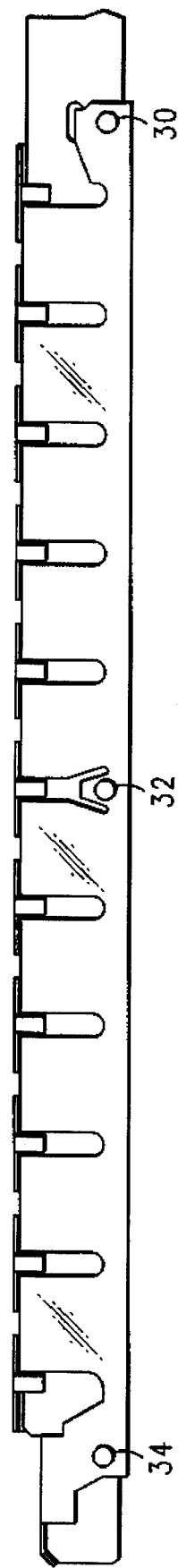
FIG. 2 is a plan view showing the assembled the RFI gasket in accordance with the preferred embodiment.

Referring now to the Figures, in particular FIG. 1, radio frequency interference (RFI) gasket 10 of the preferred embodiment is shown as comprising metal bar 12 and metallic spring clip 14, the latter of which is attached to the former. Metallic spring clip 14 is formed of approximately 0.013 cm thick metal stock and as shown has a top portion 16 and a bottom portion 18. Spring clip 14 may, for example, be stamped from the metal stock in the shape shown and be formed to be bent about its central longitudinal axis as indicated by dashed lines 20. Top and bottom portions 16 and 18 each have a plurality of tongue members 22 and 24 having slots formed between each adjacent tongue member. Each tongue member 22 and 24 has an extending member 26 centered with its respective tongue member. Respective tongue members 22 and 24 of top and bottom portions 16 and 18 are aligned to be offset to each other as shown in FIG. 1 in order that the extending members 26 reside in the slot area formed between adjacent tongue members when spring clip 14 is formed about metal bar 12 as seen in FIG. 2. As further illustrated in FIG. 2, at 30, 32, and 34, spring clip 14 may, for example be held in contact to metal bar 12 by rivets or other means. As assembled, rivets or fastening means 30, 32, and 34 securely hold spring clip 14 to metal bar 12 allowing electrical contact to be maintained therebetween while at the same time allowing the tongue members 22 and 24 to extend outwardly from metal bar 12 in an unloaded state but which can be compressed easily to make full contact with metal bar 12 by a slight pressure.

Figure 3:
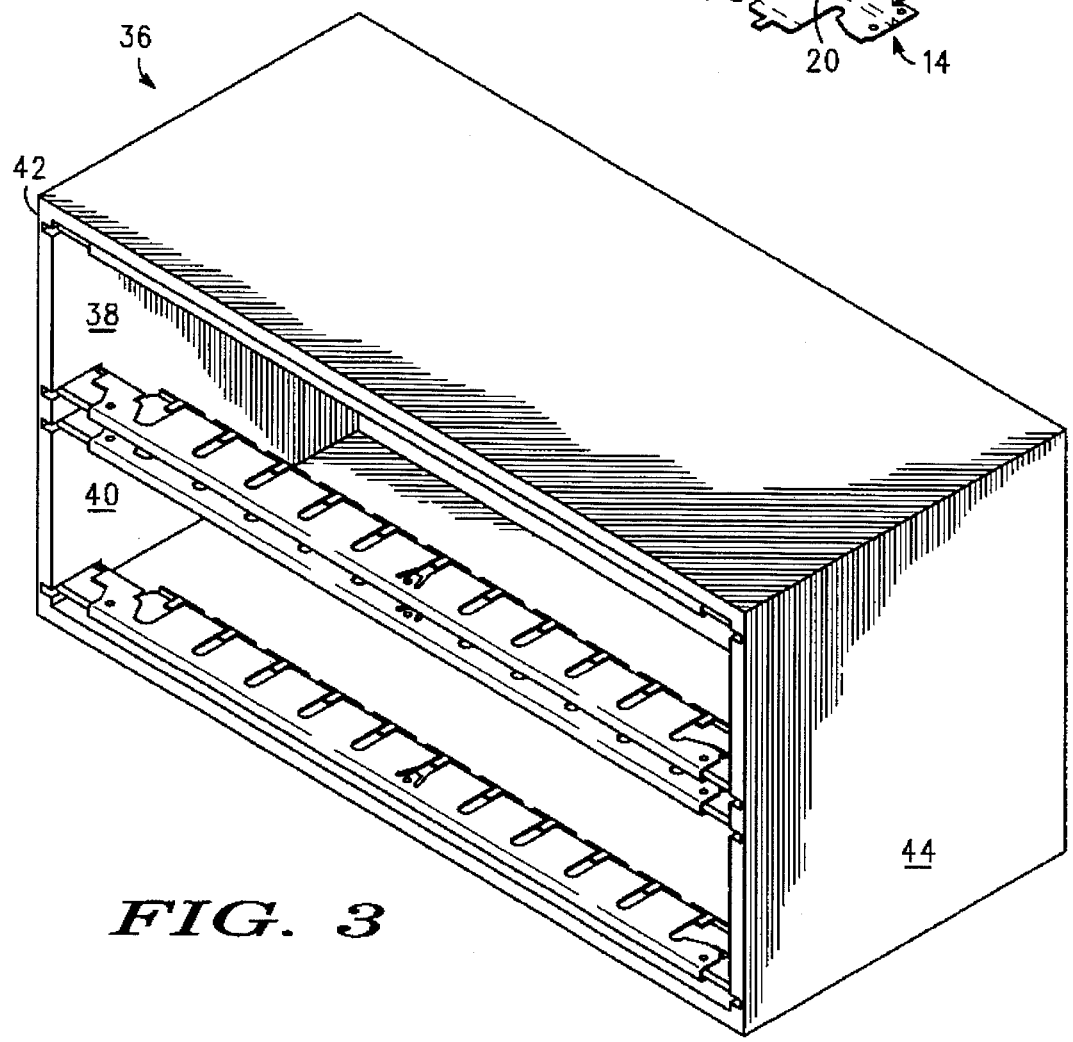
FIG. 3 is a perspective view of a chassis having the RFI gaskets assembled therein in accordance with the preferred embodiment.

Referring now to FIG. 3, there is shown chassis 36 having multiple slot subracks 38 and 40 therein which are dimensioned to receive electrical component board assemblies therein ( not shown). It is understood that chassis 36 could be a single slot sub rack assembly or have any number of slot sub rack assemblies greater than the two slots 38 and 40 shown. In a preferred embodiment, chassis 36 is manufactured dimensionally to receive computer board modules, such as standard VME computer board assemblies manufactured by Motorola, Inc. and used in its Series 900 computer. Chassis 36 is formed of metal and has slots formed in the two ends 42 and 44 into which RFI gaskets 10 can be insert as the distal ends of the aforedescribed RFI gaskets 10 are formed to fit into the slots of chassis 36.

The computer boards are dimensioned to slide into the slot subracks 38, 40, etc., typically leaving a space of approximately 0.05 cm between each computer board. Once a computer board is positioned within a slot sub rack and each of the RFI gaskets are assembled in respective slots of chassis 36, spring clips 14 are compressed between the ground planes of the respective computer boards and metal bar 12. This provides metallic and electrical contact between the computer board and chassis 36 via the respective RFI gaskets 10. Thus, by spacing the slots in chassis 36 a separator space is maintained between each of the computer boards of minimum separation but by having RFI gaskets inserted into the slots electrical contact is maintained between the edges of the computer board front panels.

At the same time, chassis 36 allows for using multiple computer board assemblies or double wide computer board assemblies in adjacent slot subracks by simply not inserting a RFI gasket therebetween. In this configuration, RFI gaskets would be placed in the upper and lower slots of chassis 36 to make electrical contact with chassis 36 and the adjacent or double wide computer board sub -assemblies. RFI gaskets 10 also provide electrical static discharge (ESD) protection to the computer board subassemblies.

Another advantage of the present invention is to provide both RFI and ESD protection to a computer having multiple computer board subassemblies while allowing industry standard sized computer boards and front panels (such as VME boards and panels) to be used with connector panel or chassis 36.

Thus, what has been described above is a novel RFI gasket that can be used in conjunction with a slotted connector panel or chassis to prevent RFI leakage from a main computer system having multi- computer board subassembly modules while also providing ESD protection. The invention allows the use of multiple computer boards or even multiple width computer boards to be easily inserted and removed from the chassis to conform to different users' configurations while eliminating the need for undesirable ground clips as found in the prior art which clip onto the front panels which can cause binding that may prevent installing of computer board modules. The RFI gasket comprising a metal bar and a spring clip dimensioned to fit into slots of a computer chassis having multi-slot subracks provides a continuous electronic bus while preventing RFI leakage from the computer system. It is to be understood that although the RFI gasket has been described in conjunction with computer board modules such RFI gaskets could be used with any electronic system requiring multiple slot subracks for receiving modular electronic modules.

What is claimed is:

1. A Radio Frequency Interference (RFI) gasket for use between panels of a chassis, the chassis having a plurality of slot subracks for receiving pluggable electronic assembly boards therein wherein the RFI gasket provides electrical ground integrally with the chassis and between adjacent assembly boards plugged into respective ones of the plurality of slot subracks of the chassis, the RFI gasket comprising:

a removable metal bar dimensioned to integrally fit into slots formed in the chassis between each panel thereof to form electrical and mechanical contact to the chassis; and a metallic spring clip which is wrapped around and contiguous with said metal bar, wherein said metallic spring clip is formed of bendable sheet metal dimensioned longitudinally substantially equal to the longitudinal length of said metal bar and said metallic spring clip having top and bottom portions respectively, each of said top and bottom portions having a plurality of slotted tongue members with each said slotted tongue member of said top and bottom portions having an extending member centered with respect to said slotted tongue member such that said extending member of a respective slotted tongue member of said top portion aligns with the slotted portion of said slotted tongue member of said bottom portion and said extending member of a respective slotted tongue member of said bottom portion aligns with the slotted portion of said slotted tongue member of said top portion as said metallic spring clip is bent and wrapped around said metal bar.

2. A RFI gasket, comprising:

a metal bar; and a metallic spring clip wrapped around and contiguous with said metal bar, said metallic spring clip making electrical contact to said metal bar, wherein said metallic spring clip is formed of bendable sheet metal having a longitudinal length substantially equal to the longitudinal length of said metal bar and having top and bottom portions each of which having a plurality of slotted tongue members each of said top and bottom portions having a plurality of slotted tongue members with each said slotted tongue member of said top and bottom portions having an extending member centered with respect to said slotted tongue member such that said extending member of a respective slotted tongue member of said top portion aligns with the slotted portion of said slotted tongue member of said bottom portion and said extending member of a respective slotted tongue member of said bottom portion aligns with the slotted portion of said slotted tongue member of said top portion as said metallic spring clip is bent and wrapped around said metal bar.

3. In a computer chassis having a plurality of slot subracks for receiving pluggable computer boards and a plurality of slots formed in opposing sides of the computer chassis for receiving RFI gaskets, each RFI gasket comprising:

a removable metal bar dimensioned to integrally fit into a respective pair of the slots formed in opposing sides of the computer chassis between the slot subracks thereof and forming electrical and mechanical contact to the computer chassis; and a metallic spring clip which is wrapped around and contiguous to said metal bar, said metallic spring clip making electrical contact between a computer board, said metal bar, and the computer chassis to inhibit RFI radiation therefrom, wherein said metallic spring clip is formed of bendable sheet metal and having a longitudinal length substantially equal to the longitudinal length of said metal bar and having top and bottom portions each of said top and bottom portions having a plurality of slotted tongue members with each said slotted tongue member of said top and bottom portions having an extending member centered with respect to said slotted tongue member such that said extending member of a respective slotted tongue member of said top portion aligns with the slotted portion of said slotted tongue member of said bottom portion and said extending member of a respective slotted tongue member of said bottom portion aligns with the slotted portion of said slotted tongue member of said top portion as said metallic spring clip is bent and wrapped around said metal bar.

* * * * *